US009465068B2

(12) United States Patent
Ikeda

(10) Patent No.: US 9,465,068 B2
(45) Date of Patent: Oct. 11, 2016

(54) TEST METHOD FOR SEMICONDUCTOR DEVICE HAVING STACKED PLURAL SEMICONDUCTOR CHIPS

(71) Applicant: Elpida Memory, Inc., Tokyo (JP)

(72) Inventor: Hiroaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 385 days.

(21) Appl. No.: 13/943,315

(22) Filed: Jul. 16, 2013

(65) Prior Publication Data

US 2014/0021978 A1 Jan. 23, 2014

(30) Foreign Application Priority Data

Jul. 20, 2012 (JP) ................................. 2012-161806

(51) Int. Cl.

*G01R 31/26* (2014.01)
*G11C 29/02* (2006.01)
*G01R 31/28* (2006.01)
*G11C 29/50* (2006.01)

(52) U.S. Cl.

CPC ....... *G01R 31/2601* (2013.01); *G01R 31/2889* (2013.01); *G11C 29/025* (2013.01); *G01R 31/2884* (2013.01); *G11C 2029/5006* (2013.01); *H01L 2224/16145* (2013.01); *H01L 2224/16225* (2013.01); *H01L 2924/15311* (2013.01)

(58) Field of Classification Search

None

See application file for complete search history.

(56) References Cited

U.S. PATENT DOCUMENTS

| | | | | |
|---|---|---|---|---|
| 8,659,018 | B2 * | 2/2014 | Shimada et al. | 257/48 |
| 2008/0265430 | A1 | 10/2008 | Ishihara | |
| 2011/0175639 | A1 * | 7/2011 | Yoko | G06F 1/12 324/762.06 |

FOREIGN PATENT DOCUMENTS

| | | |
|---|---|---|
| JP | 2005-136187 A | 5/2005 |

* cited by examiner

*Primary Examiner* — Paresh Patel
(74) *Attorney, Agent, or Firm* — Foley & Lardner LLP

(57) ABSTRACT

Disclosed herein is a method for testing a semiconductor device, the method includes: preparing a first semiconductor chip having a first bump electrode and a first driver circuit that drives the first bump electrode, and a second semiconductor chip having a second bump electrode and a second driver circuit that drives the second bump electrode; staking the first and second semiconductor chips so that the first bump electrode and the second bump electrode are electrically connected to each other to form a current path including the first and second bump electrodes; and driving, in a test mode, the current path to a first potential by the first driver circuit while driving the current path to a second potential different from the first potential by the second driver circuit.

10 Claims, 13 Drawing Sheets

TIME →

DRIVER CIRCUIT NUMBER ↓

| | 0 | 1 | 2 | 3 | 4 | 5 | 6 | 7 | ··· | N |
|---|---|---|---|---|---|---|---|---|---|---|
| 0 | H | L | L | L | L | L | L | L | ··· | L |
| 1 | L | H | L | L | L | L | L | L | ··· | L |
| 2 | L | L | H | L | L | L | L | L | ··· | L |
| 3 | L | L | L | H | L | L | L | L | ··· | L |
| 4 | L | L | L | L | H | L | L | L | ··· | L |
| 5 | L | L | L | L | L | H | L | L | ··· | L |
| 6 | L | L | L | L | L | L | H | L | ··· | L |
| 7 | L | L | L | L | L | L | L | H | ··· | L |
| ⋮ | ⋮ | ⋮ | ⋮ | ⋮ | ⋮ | ⋮ | ⋮ | ⋮ | | ⋮ |
| N | L | L | L | L | L | L | L | L | ··· | H |

FIG.7

TEST METHOD FOR SEMICONDUCTOR DEVICE HAVING STACKED PLURAL SEMICONDUCTOR CHIPS

BACKGROUND OF THE INVENTION

1. Field of the Invention

The present invention relates to a test method for a semiconductor device, and more particularly relates to a test method for a semiconductor device including a plurality of stacked semiconductor chips that are bump-connected with each other.

2. Description of Related Art

Storage capacity required for semiconductor memory devices such as DRAM (Dynamic Random Access Memory) has been growing year by year. To satisfy the requirement, in recent years, a memory device called multi-chip package has been proposed. In the multi-chip package, a plurality of memory chips are stacked. However, in the case of the multi-chip package, a wire needs to be provided for each chip to connect each memory chip and a package substrate. Therefore, it is difficult to stack many memory chips.

On the other hand, in recent years, a semiconductor device of a type in which a plurality of memory chips with penetrating electrodes are stacked has been proposed (See Japanese Patent Application Laid-Open No. 2005-136187). In the semiconductor device of the type, among penetrating electrodes provided on each memory chip, the penetrating electrodes that are provided on the same plane position when seen from a stacking direction are electrically short-circuited. Therefore, even if the number of chips stacked increases, the number of electrodes connected to the package substrate does not increase. Thus, it is possible to stack a larger number of memory chips.

When semiconductor chips with penetrating electrodes are stacked, bump electrodes that are provided on upper and lower chips need to be in accurate contact with each other. Accordingly, compared with an operation of stacking chips in the multi-chip package, more accurate positioning is required.

However, when the semiconductor chips having the penetrating electrodes are once stacked, connection states of the bump electrodes cannot be visually checked. Accordingly, to evaluate whether a connection failure occurs, a highly accurate load circuit or measurement circuit needs to be mounted on each of the semiconductor chips, which increases the chip area. Furthermore, an evaluation using a load circuit or a measurement circuit mounted on each semiconductor chip requires quite a long time when the number of bump electrodes is large.

SUMMARY

In one embodiment, there is provided a method for testing a semiconductor device, the method includes: preparing a first semiconductor chip having a first bump electrode and a first driver circuit that drives the first bump electrode, and a second semiconductor chip having a second bump electrode and a second driver circuit that drives the second bump electrode; staking the first and second semiconductor chips so that the first bump electrode and the second bump electrode are electrically connected to each other to form a current path including the first and second bump electrodes; and driving, in a test mode, the current path to a first potential by the first driver circuit while driving the current path to a second potential different from the first potential by the second driver circuit.

According to the present invention, a consumption current is purposefully increased by causing a so-called bus fight during a test mode. Therefore, connection states of bump electrodes can be evaluated only by observing a change in the consumption current.

BRIEF DESCRIPTION OF THE DRAWINGS

FIG. 7 is a diagram for explaining a scan operation for driver circuits to output high-level data in turn;

DETAILED DESCRIPTION OF THE EMBODIMENTS

Preferred embodiments of the present invention will be explained below in detail with reference to the accompanying drawings.

Figure 1:
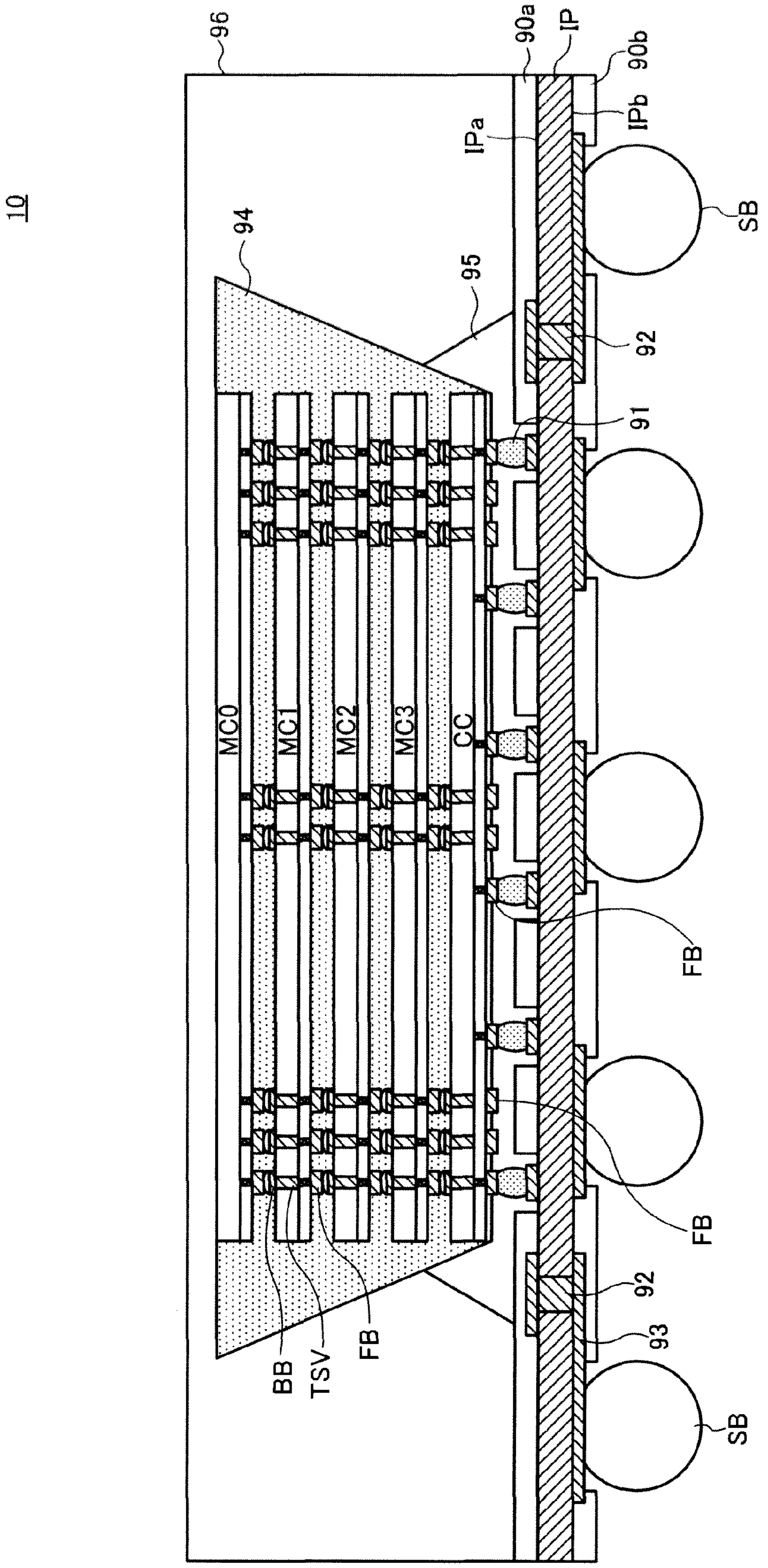
FIG. 1 is a schematic cross-sectional view of a semiconductor device of the present invention.

Referring now to FIG. 1, the semiconductor device 10 of the embodiment has a structure in which the following components are stacked: four memory chips MC0 to MC3, which have the same functions and are produced with the use of the same production mask; one control chip CC, which is produced with the use of a different production mask from that of the memory chips MC0 to MC3; and one interposer IP. The memory chips MC0 to MC3 and the control chip CC are semiconductor chips for which a silicon substrate is used, and are stacked by a face-down method on the interposer IP. The face-down method means a method of mounting semiconductor chips in such a way that principal surfaces on which electronic circuits such as transistors are formed face downward, or that the principal surfaces face the interposer IP's side.

However, the semiconductor device of the present invention is not limited to the above structure. The semiconductor chips each may be stacked by a face-up method. The face-up method means a method of mounting semiconductor chips in such a way that principal surfaces on which electronic circuits such as transistors are formed face upward, or that the principal surfaces face a side opposite to the interposer IP's side. Alternatively, the semiconductor chips stacked by the face-down method, and the semiconductor chips stacked by the face-up method may exist together.

Among the semiconductor chips, the memory chips MC1 to MC3 and the control chip CC other than the memory chip MC0 placed on the top layer are provided with large numbers of penetrating electrodes (through-substrate vias) TSV that pass through a substrate. Also, TSV may be called penetration electrodes, penetration vias, through electrode, or through-vias. In areas that overlap with the penetrating electrodes TSV when seen from a stacking direction in planar view, top-surface bumps FB are provided on the principal-surface sides of the chips, and back-surface bumps BB are provided on the back-surface sides of the chips. The back-surface bumps BB of a semiconductor chip placed on a lower layer are bonded to the top-surface bumps FB of a semiconductor chip placed on an upper layer. In this manner, the semiconductor chips that are adjacent to each other in the vertical direction are electrically connected. Incidentally, in the present invention, when it is not particularly necessary that the top-surface bumps FB and back-surface bumps BB are distinguished, these may be called "bump electrodes".

According to the present embodiment, the reason why no penetrating electrode TSV is provided on the top-layer memory chip MC0 is because there is no need to form a bump electrode on the back-surface side of the memory chip MC0 as the chips are stacked by the face-down method. If no penetrating electrode TSV is provided on the top-layer memory chip MC0 as described above, the top-layer memory chip MC0 can be made thicker than the other memory chips MC1 to MC3 to increase the mechanical strength of the memory chip MC0. However, according to the present invention, a penetrating electrode TSV may be provided on the top-layer memory chip MC0. In this case, all the memory chips MC0 to MC3 can be produced by the same process.

Memory chip MC0 to MC3 is wide I/O SDRAM (Synchronous Dynamic Random Access Memory) whose data bus width is several hundred to several thousand bits. The control chip CC controls operation of the memory chip MC0 to MC3 and plays a function as an interface with the outside. Therefore, all access from the outside is performed through control chip CC, and input and output of data are also performed through control chip CC.

The interposer IP is a circuit board made of resin. On a back surface IPb thereof, a plurality of external terminals (solder balls) SB are formed. The interposer IP ensures the mechanical strength of the semiconductor device 10 and functions as a redistribution substrate (or a rewiring substrate) to expand an electrode pitch. That is, substrate electrodes 91 that are formed on a top surface IPa of the interposer IP are led out to the back surface IPb via through-hole electrodes 92; rewiring layers 93 that are provided on the back surface IPb are designed to expand the pitch of the external terminals SB. The areas of the top surface IPa of the interposer IP where no substrate electrode 91 is formed are covered with resist 90*a*. The areas of the back surface IPb of the interposer IP where no external terminal SB is formed are covered with resist 90*b*. FIG. 1 shows only five external terminals SB. However, a large number of external terminals are actually provided.

The gaps between the memory chips MC0 to MC3 and control chip CC stacked are filled with underfill 94. In this manner, the mechanical strength is ensured. The gap between the interposer IP and the control chip CC is filled with NCP (Non-Conductive Paste) 95. The entire package is covered with mold resin 96. In this manner, each chip is physically protected.

Most of the penetrating electrodes TSV provided on the memory chips MC0 to MC3 are connected to the top-surface bumps FB and back-surface bumps BB that are provided at the same locations in planar view.

Figure 2:
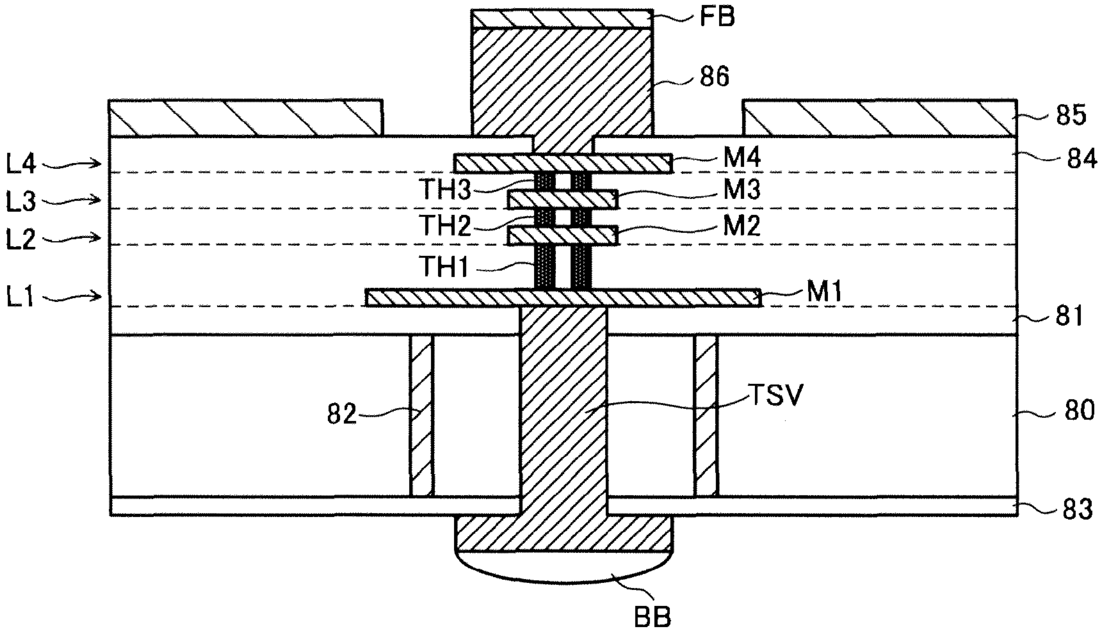
FIG. 2 is a cross-sectional view of a penetrating electrode TSV.

Turning to FIG. 2, the penetrating electrode TSV is so provided as to pass through a silicon substrate 80, an interlayer insulation film 81, which is provided on a top surface of the silicon substrate 80, and a passivation film 83, which is provided on a back surface of the silicon substrate 80. Although not specifically limited, the penetrating electrode TSV is made of Cu (copper). The top surface of the silicon substrate 80 serves as a device formation surface on which devices such as transistors are formed. Around the penetrating electrode TSV, insulation rings 82 are provided to insulate the penetrating electrode TSV from a transistor region. In the example shown in FIG. 2, two insulation rings 82 are provided. One insulation ring 82, instead of two, may be provided. When two insulation rings 82 are provided, capacitance between the penetrating electrode TSV and the silicon substrate 80 can be reduced.

An end portion of the penetrating electrode TSV that is closer to the back surface of the silicon substrate 80 is covered with a back-surface bump BB. In the memory chips MC1 to MC3, the back-surface bumps BB are in contact with the top-surface bumps FB provided on upper-layer memory chips MC0 to MC2, respectively. In the control chip CC, the back-surface bumps BB are in contact with the top-surface bumps FB provided on the memory chip MC3. Although not specifically limited, the back-surface bumps BB are made of SnAg solder, which covers the surfaces of the penetrating electrodes TSV made of Cu (copper). The top-surface bump FB is connected to an end portion of the penetrating electrode TSV via pads M1 to M4, which are provided in wiring layers L1 to L4, and a plurality of through-hole electrodes TH1 to TH3, which connect the pads. In the memory chips MC1 to MC3, the top-surface bumps FB are in contact with the back-surface bumps BB provided on the lower-layer memory chips MC2 and MC3 and the interface chips IF, respectively. In the control chip CC, the top-surface bumps FB are in contact with the substrate electrodes 91 on the interposer IP. Although not specifically limited, the top-surface bumps FB include a pillar portion 86 that is made of Cu (copper). A surface of the pillar portion 86 includes a structure in which layers of Ni (nickel) and Au (gold) are stacked. The diameter of the top-surface bumps FB and back-surface bumps BB is about 20 μm.

According to the above configuration, the top-surface bumps FB and back-surface bumps BB that are provided at the same locations in planar view are being short-circuited via the penetrating electrodes TSV. The pillar portion 86 of a top-surface bump FB is so provided as to pass through a passivation film 84. A top surface of the passivation film 84 except a region where the top-surface bump FB is formed is covered with a polyimide film 85. Incidentally, the connection to internal circuits not shown in the diagram is realized via internal wires (not shown), which are led out from the pads M1 to M4 provided in the wiring layers L1 to L4.

Incidentally, in the control chip CC, this kind of the penetrating electrodes TSV which short-circuit the top-surface bumps FB and back-surface bumps BB are provided as part of a plurality of the penetrating electrodes TSV. Such penetrating electrodes TSV provided on the control chip CC are used mainly for supplying power supply potential VDD or ground potential VSS.

Most of the other penetrating electrodes TSV provided on the control chip CC are connected to the back-surface bumps BB that are provided at the same locations in planar view, but not connected to the top-surface bumps FB that are provided at the same locations in planar view. Although not shown, this kind of the penetrating electrodes have a structure in which any of the through-hole electrodes TH1 to TH3 is omitted.

Because the memory chips MC0 to MC3 and the control chip CC are stacked in such a manner that the top-surface bumps FB and the back-surface bumps BB facing each other are bonded as shown in FIG. 1, a plurality of signal paths commonly connected to these semiconductor chips are formed in the semiconductor device 10. These signal paths include a bidirectional data bus for transmitting or receiving read data and write data, an address bus and a command bus for transmitting an address signal and a command signal, respectively, and the like. The address bus and the command bus are unidirectional buses from the control chip CC to the memory chips MC0 to MC3.

Figure 3:
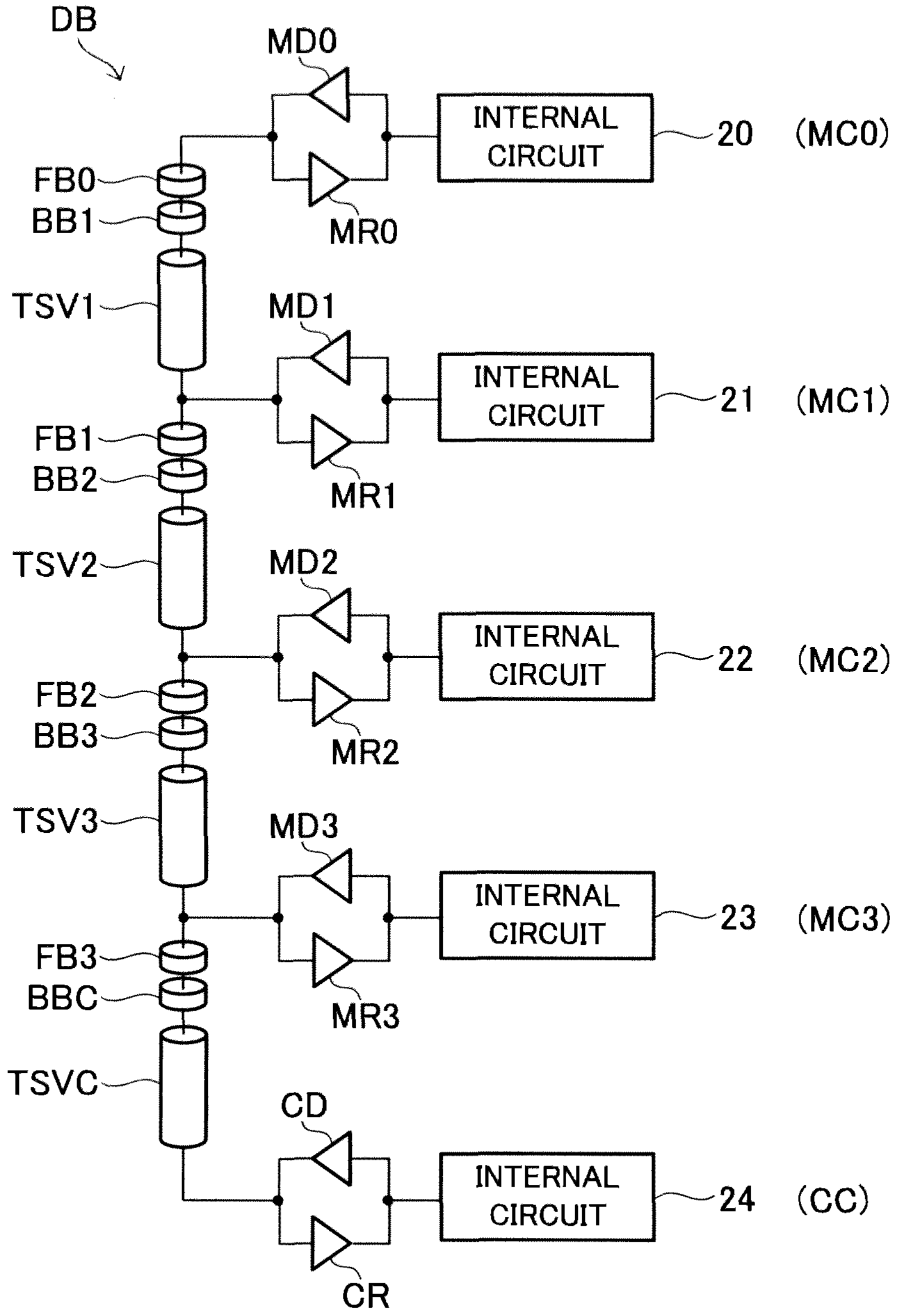
FIG. 3 is a schematic diagram for explaining a structure of a bidirectional data bus DB.

Turning to FIG. 3, the bidirectional data bus DB is commonly connected to the memory chips MC0 to MC3 and the control chip CC through four penetrating electrodes TSV1 to TSV3 and TSVC. The penetrating electrodes TSV1 to TSV3 are provided to pass through the memory chips MC1 to MC3, respectively, and the penetrating electrode TSVC is provided to pass through the control chip CC. Reference characters FB0 to FB3 shown in FIG. 3 denote top-surface bumps provided on the memory chips MC0 to MC3, respectively, BB1 to BB3 denote back-surface bumps provided on the memory chips MC1 to MC3, respectively, and BBC denotes a back-surface bump provided on the control chip CC. As mentioned above, the top-surface bump FB of a chip in an upper layer is bonded with the back-surface bump BB of a chip in the underlying layer, thereby constituting one bidirectional data bus DB commonly connected to the memory chips MC0 to MC3 and the control chip CC.

With this configuration, read data output from an internal circuit 20 of the memory chip MC0 is output to the bidirectional data bus DB via a driver circuit MD0 and supplied to the control chip CC through the penetrating electrodes TSV1 to TSV3 and TSVC. The control chip CC supplies the read data on the bidirectional data bus DB to an internal circuit 24 via a receiver circuit CR. Write data output from the internal circuit 24 of the control chip CC is output to the bidirectional data bus DB via a driver circuit CD and supplied to the memory chip MC0 through the penetrating electrodes TSVC and TSV3 to TSV1. The memory chip MC0 supplies the write data on the bidirectional data bus DB to the internal circuit 20 via a receiver circuit MR0. In transmission of these signals, the signals pass through four bonding points of the bump electrodes, that is, a bonding point of a top-surface bump FB0 and a back-surface bump BB1, a bonding point of a top-surface bump FB1 and a back-surface bump BB2, a bonding point of a top-surface bump FB2 and a back-surface bump BB3, and a bonding point of a top-surface bump FB3 and a back-surface bump BBC.

Read data output from an internal circuit 21 of the memory chip MC1 is output to the bidirectional data bus DB via a driver circuit MD1 and supplied to the control chip CC through the penetrating electrodes TSV2, TSV3, and TSVC. Write data output from the internal circuit 24 of the control chip CC is output to the bidirectional data bus DB via the driver circuit CD and supplied to the memory chip MC1 through the penetrating electrodes TSVC, TSV3, and TSV2. The memory chip MC1 supplies the write data on the bidirectional data bus DB to the internal circuit 21 via a receiver circuit MR1. In transmission of these signals, the signals pass through three bonding points of the bump electrodes, that is, the bonding point of the top-surface bump FB1 and the back-surface bump BB2, the bonding point of the top-surface bump FB2 and the back-surface bump BB3, and the bonding point of the top-surface bump FB3 and the back-surface bump BBC.

Furthermore, read data output from an internal circuit 22 of the memory chip MC2 is output to the bidirectional data bus DB via a driver circuit MD2 and supplied to the control chip CC through the penetrating electrodes TSV3 and TSVC. Write data output from the internal circuit 24 of the control chip CC is output to the bidirectional data bus DB via the driver circuit CD and supplied to the memory chip MC2 through the penetrating electrodes TSVC and TSV3. The memory chip MC2 supplies the write data on the bidirectional data bus DB to the internal circuit 22 via a receiver circuit MR2. In transmission of these signals, the signals pass through two bonding points of the bump electrodes, that is, the bonding point of the top-surface bump FB2 and the back-surface bump BB3 and the bonding point of the top-surface bump FB3 and the back-surface bump BBC.

Read data output from an internal circuit 23 of the memory chip MC3 is output to the bidirectional data bus DB via a driver circuit MD3 and supplied to the control chip CC through the penetrating electrode TSVC. Write data output from the internal circuit 24 of the control chip CC is output to the bidirectional data bus DB via the driver circuit CD and supplied to the memory chip MC3 through the penetrating electrode TSVC. The memory chip MC3 supplies the write data on the bidirectional data bus DB to the internal circuit 23 via a receiver circuit MR3. In transmission of these signals, the signals pass through one bonding point of the bump electrodes, that is, the bonding point of the top-surface bump FB3 and the back-surface bump BBC.

Each of the internal circuits 20 to 23 included in the memory chips MC0 to MC3 is a functional block including a memory cell array. In a normal operation mode, the driver circuit CD in the control chip CC is deactivated while read data is output from the memory chips MC0 to MC3. That is, the driver circuit CD is brought into a higher impedance state relative to the bidirectional data bus DB. Similarly, the driver circuits MD in the memory chips MC0 to MC3 are deactivated while write data is output from the control chip CC. That is, the driver circuits MD are brought into a higher impedance state relative to the bidirectional data bus DB.

As described above, the bidirectional data bus DB that connects the internal circuits 20 to 23 in the memory chips MC0 to MC3 with the internal circuit 20 in the control chip CC has a plurality of bonding points of the bump electrodes. Accordingly, when at least one of these bonding points is constituted by an insufficient contact (loose contact), signal qualities of read data and write data transmitted or received via the bidirectional data bus DB are deteriorated. Incidentally, when a bonding point causes a completely open failure, that is, in a case where the top-surface bump FB and the back-surface bump BB are completely separated or an insulating foreign substance is located therebetween so that the bidirectional data bus DB is divided, transmission or reception of read data and write data becomes impossible and therefore such a failure can be easily detected by an operation test. Similarly, when a part of the bidirectional data bus DB causes a short-circuit failure, that is, in a case where the penetrating electrode TSV, the top-surface bump FB, or the back-surface bump BB is in contact with another line (a power supply line, for example), transmission or reception of read data and write data becomes impossible and therefore such a failure can be easily detected by an operation test.

On the other hand, when a so-called loose contact occurs, whether transmission or reception of read data and write data is possible depends on operation environments or operation conditions and thus is not easy to detect. A bonding point where a loose contact occurs has a slightly higher resistance than normal bonding points and therefore can be detected by performing resistance measurement according to a so-called four-terminal method. However, to perform the resistance measurement according to a four-terminal method, a highly accurate load circuit or measurement circuit needs to be mounted on each semiconductor chip, which increases the chip area. Furthermore, because the resistance measurement according to the four-terminal method requires a certain time, quite a long time is required to check all signal paths when a data bus width is quite large as in a wide I/O DRAM.

The semiconductor device 10 according to the present embodiment solves these problems and can easily detect a position where a loose contact occurs without a load circuit or a measurement circuit mounted thereon. A method of detecting a loose contact according to the present embodiment is explained below.

Figure 4:
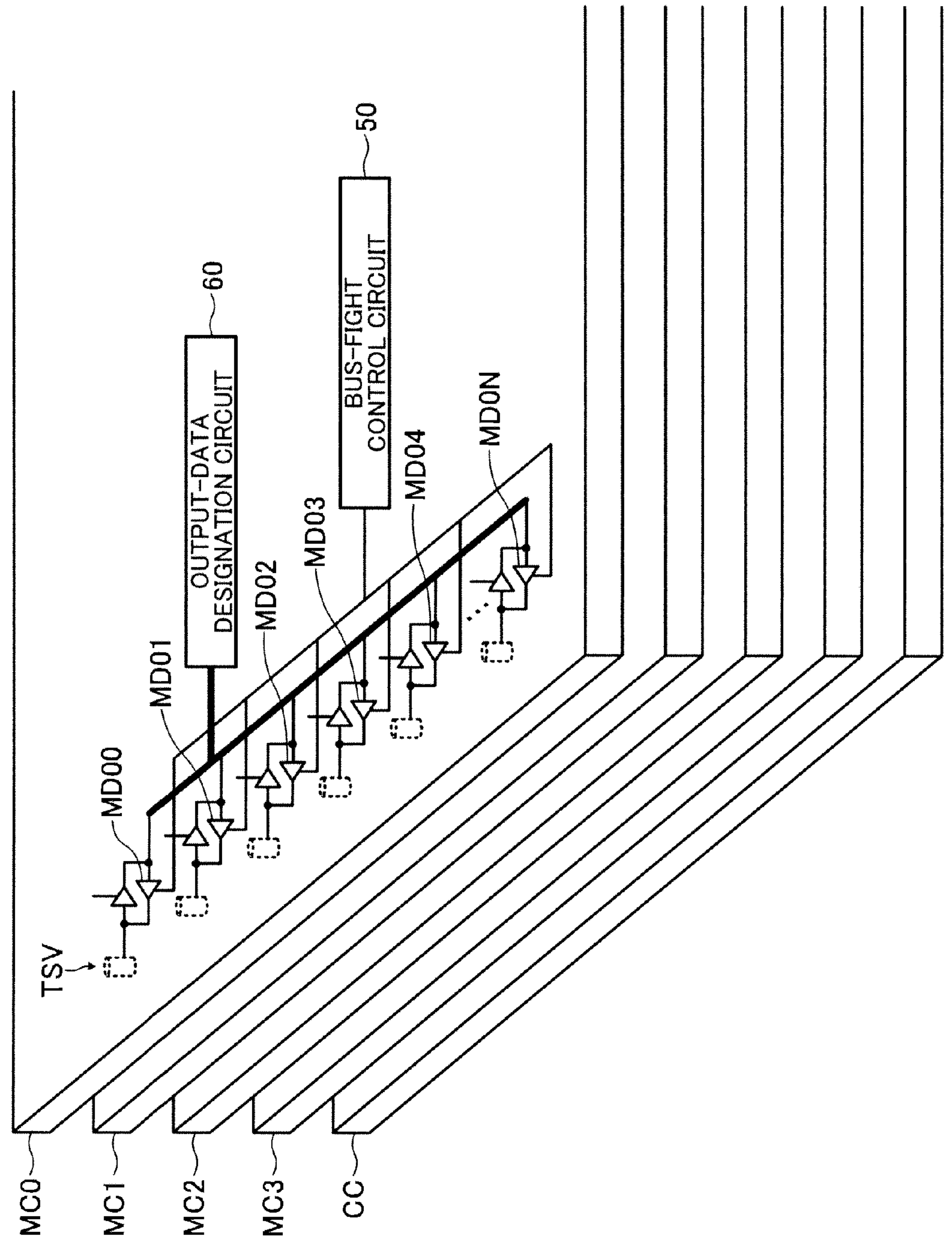
FIG. 4 is a block diagram showing a test circuit provided in a memory chip MC0 shown in FIG. 1.

Turning to FIG. 4, the memory chip MC0 includes a plurality of driver circuits MD00 to MD0N to which a bus-fight control circuit 50 and an output-data designation circuit 60 that constitute a test circuit are connected. The bus-fight control circuit 50 and the output-data designation circuit 60 are activated in a test mode and deactivated in a normal operation mode. The bus-fight control circuit 50 is a circuit that forcibly activates any one of the driver circuits MD00 to MD0N and the activated driver circuit is forcibly activated regardless of whether driver circuits of other semiconductor chips connected to the corresponding bidirectional data bus are activated. A boundary scan circuit mounted on a general DRAM can be used as the bus-flight control circuit 50.

The output-data designation circuit 60 supplies output data to the driver circuit activated by the bus-fight control circuit 50. The output data to be supplied to the driver circuit is a 1-bit binary signal and the driver circuit outputs either a signal at a VDD level (high potential level) or a signal at a VSS level (low potential level) to the corresponding bidirectional data bus according to the binary signal.

Although not shown, the bus-fight control circuit 50 and the output-data designation circuit 60 are similarly provided in other memory chips MC1 to MC3 and the control chip CC, and the bus-fight control circuits 50 and the output-data designation circuits 60 provided in the semiconductor chips operate in conjunction with each other under control of a tester explained later.

Figure 5:
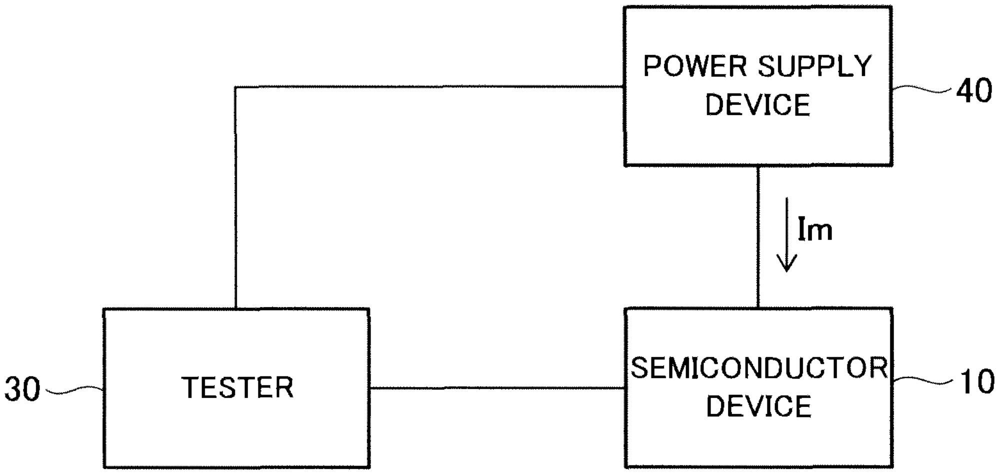
FIG. 5 is a block diagram showing a state where a test device is connected to the semiconductor device 10 shown in FIG. 1.

Turning to FIG. 5, the test device for the semiconductor device 10 includes a tester 30 and a power supply device 40. The tester 30 is a device for controlling the operation of the semiconductor device 10 and the power supply device 40 is a device for supplying an operation power to the semiconductor device 10. The tester 30 has a function of monitoring a consumption current Im flowing from the power supply device 40 to the semiconductor device 10. The tester 30 controls operations of the bus-fight control circuits 50 and the output-data designation circuits 60 provided in the semiconductor chips and identifies a position where a loose contact occurs by monitoring the consumption current Im in synchronization with the operations of the bus-fight control circuits 50 and the output-data designation circuits 60. This operation is specifically explained below.

Figure 6:
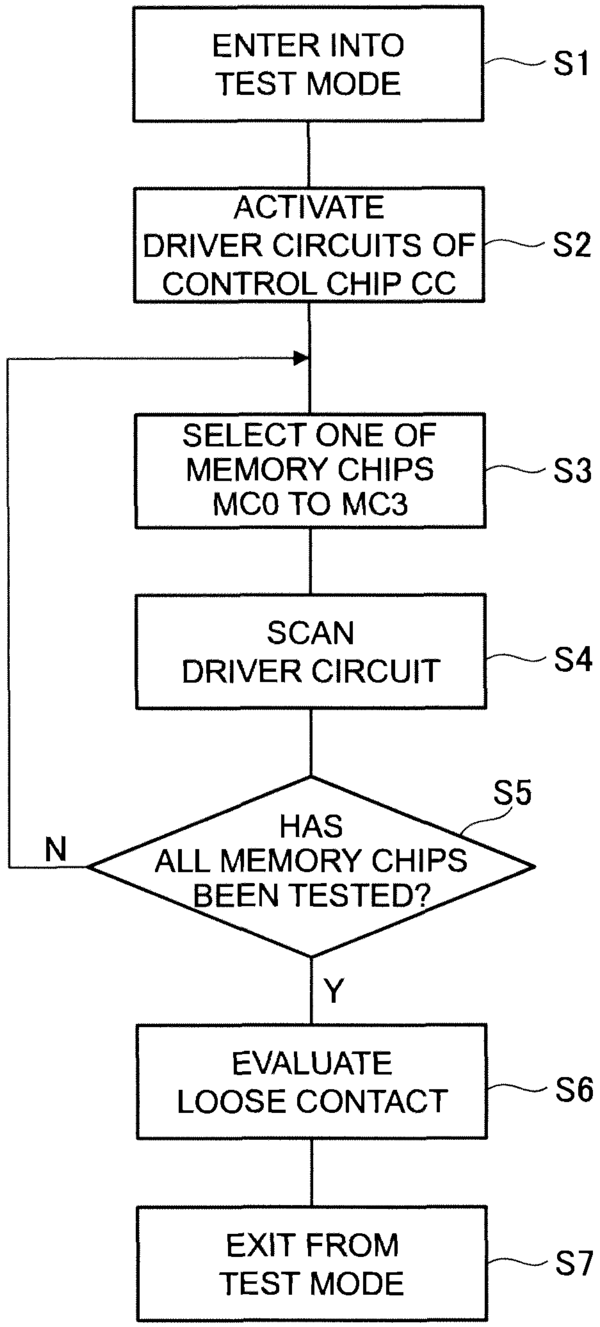
FIG. 6 is a flowchart for explaining a test method for a semiconductor device according to the present embodiment.

Turning to FIG. 6, the tester 30 first causes the semiconductor device 10 to enter into the test mode by issuing a test command (Step S1). When the semiconductor device 10 enters into the test mode, the bus-fight control circuits 50 and the output-data designation circuits 60 provided in the semiconductor chips become active. At that time, in the control chip CC, the driver circuits to be tested are all activated and all the driver circuits output data at a low level, that is, the VSS level under control of the bus-fight control circuit 50 and the output-data designation circuit (Step S2).

The tester 30 then selects any one of the memory chips MC0 to MC3 (Step S3). In the selected memory chip, all the driver circuits to be tested are activated under control of the bus-fight control circuit 50. In unselected memory chips, all the driver circuits to be tested are deactivated under control of the bus-fight control circuit 50, which brings these driver circuits into a higher impedance state relative to the corresponding bidirectional data bus.

In the selected memory chip, the driver circuits output data at a high level, that is, a VDD level in turn under control of the output-data designation circuit 60 (Step S4). Outputs of other driver circuits are kept at a low level.

Turning to FIG. 7, the horizontal axis of a table represents the time and the vertical axis represents the driver circuit number. In an example shown in FIG. 7, at a time i (i=0 to N), high-level data is output from a driver circuit i and outputs from other driver circuits are kept at a low level. In this way, N+1 driver circuits output high-level data in turn.

When such a scan operation is performed, a so-called bus fight occurs on a bidirectional data bus to which high-level data is output. That is, because high-level data is output from a selected memory chip MC and low-level data is output from the control chip CC, a through current flows through the corresponding signal path. The through current greatly increases the consumption current Im of the semiconductor device 10. Such a change in the consumption current Im is measured by the tester 30.

Such a measurement operation is performed for each of the memory chips MC0 to MC3 (Steps S3 to S5) and, after the measurement operation is performed for all the memory chips MC0 to MC3, a change in the consumption current Im is evaluated by the tester 30 (Step S6).

Figure 8A:
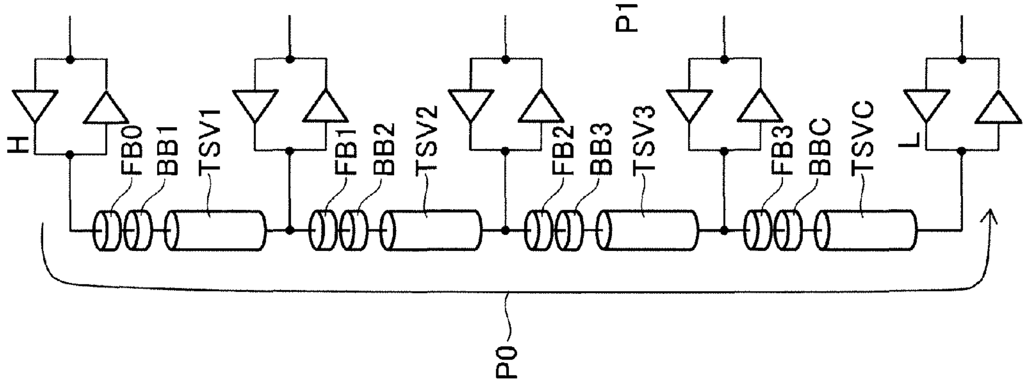
FIG. 8A is a schematic diagram showing a current path P0 in a case where a memory chip MC0 is selected.

Turning to FIG. 8A, when the memory chip MC0 is selected, the current path P0 through which a through current flows passes four penetrating electrodes TSV1 to TSV3 and TSVC. At that time, there are four bonding points of the bump electrodes on the current path P0. That is, there are the bonding point of the top-surface bump FB0 and the back-surface bump BB1, the bonding point of the top-surface bump FB1 and the back-surface bump BB2, the bonding point of the top-surface bump FB2 and the back-surface bump BB3, and the bonding point of the top-surface bump FB3 and the back-surface bump BBC. Therefore, if a current amount of the through current flowing through the current path P0 is small, at least one of these four bonding points is possibly in a loose contact.

Figure 8B:
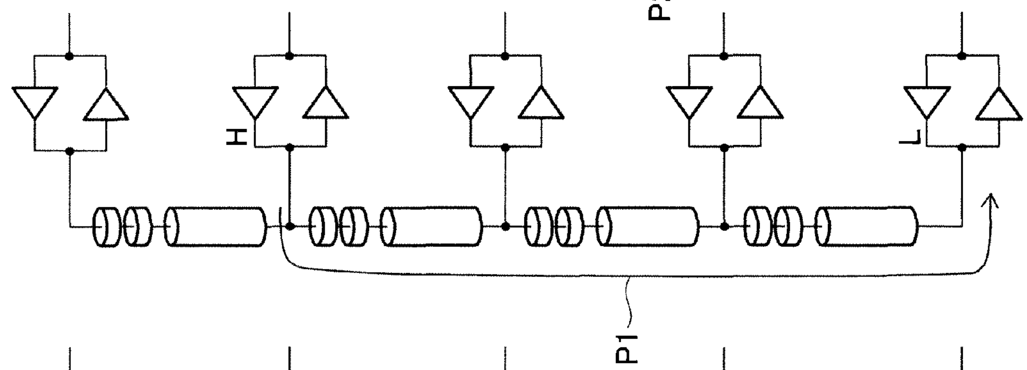
FIG. 8B is a schematic diagram showing a current path P1 in a case where a memory chip MC1 is selected.

Turning to FIG. 8B, when the memory chip MC1 is selected, the current path P1 through which a through current flows passes three penetrating electrodes TSV2, TSV3, and TSVC. At that time, there are three bonding points of the bump electrodes on the current path P1. That is, there are the bonding point of the top-surface bump FB1 and the back-surface bump BB2, the bonding point of the top-surface bump FB2 and the back-surface bump BB3, and the bonding point of the top-surface bump FB3 and the back-surface bump BBC. Therefore, if a current amount of the through current flowing through the current path P1 is small, at least one of these three bonding points is possibly in a loose contact.

Figure 8C:
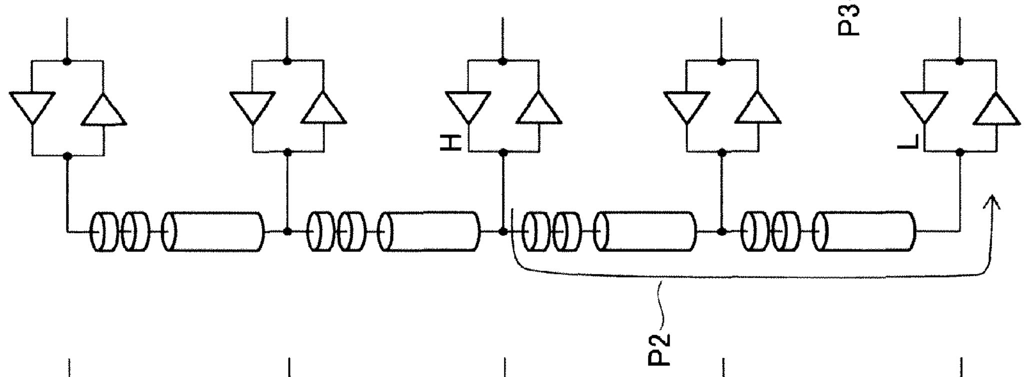
FIG. 8C is a schematic diagram showing a current path P2 in a case where a memory chip MC2 is selected.

Turning to FIG. 8C, when the memory chip MC2 is selected, the current path P2 through which a through current flows passes two penetrating electrodes TSV3 and TSVC. At that time, there are two bonding points of the bump electrodes on the current path P2. That is, there are the bonding point of the top-surface bump FB2 and the back-surface bump BB3 and the bonding point of the top-surface bump FB3 and the back-surface bump BBC. Therefore, if a current amount of the through current flowing through the current path P2 is small, at least one of these two bonding points is possibly in a loose contact.

Figure 8D:
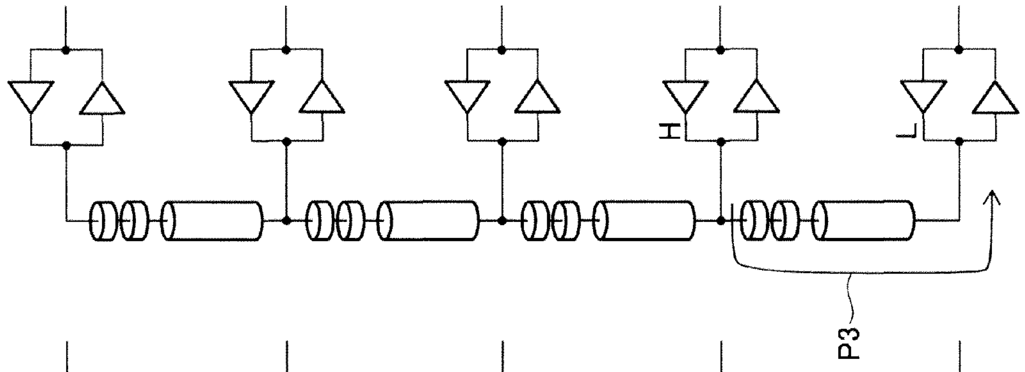
FIG. 8D is a schematic diagram showing a current path P3 in a case where a memory chip MC3 is selected.

Turning to FIG. 8D, when the memory chip MC3 is selected, the current path P3 through which a through current flows passes one penetrating electrode TSVC. At that time, there is one bonding point of the bump electrodes on the current path P3. That is, there is the bonding point of the top-surface bump FB3 and the back-surface bump BBC. Therefore, if a current amount of the through current flowing through the current path P3 is small, this bonding point is possibly in a loose contact.

Figure 9A:
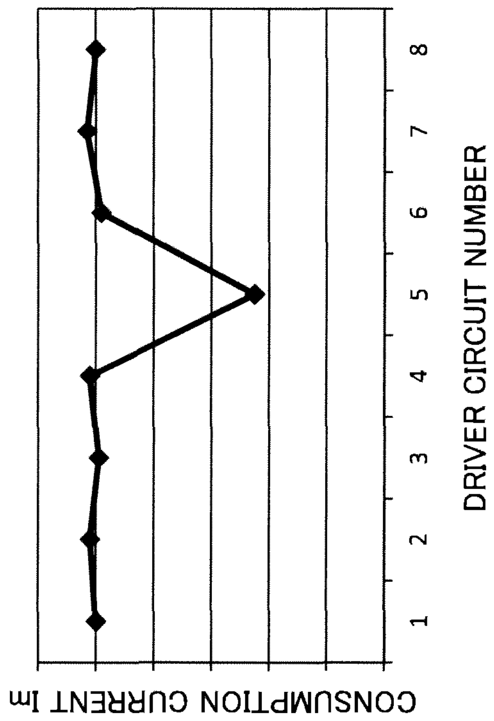
FIG. 9A is an example of a monitoring result of the consumption current Im by a tester 30 and shows a monitoring result in a case where the memory chip MC0 is selected.

Turning to in FIG. 9A, as a result of successive scanning of a plurality of driver circuits at a high level, the consumption current Im greatly decreases at the time of driving a fifth driver circuit. A decrease in the consumption current Im results from an increase in resistance of the current path P0, which means that the current path P0 corresponding to the fifth driver circuit includes a position where a loose contact occurs.

Figure 9B:
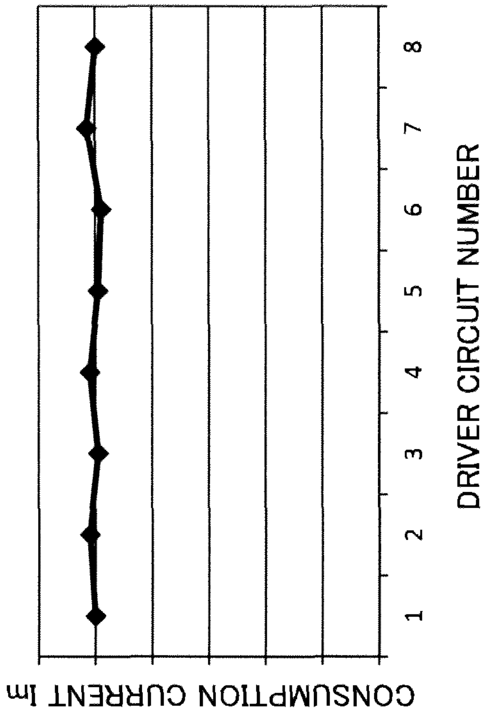
FIG. 9B is an example of a monitoring result of the consumption current Im by a tester 30 and shows a monitoring result in a case where the memory chip MC1 is selected.

On the other hand, turning to FIG. 9B, a great decrease in the consumption current Im does not occur even when a plurality of driver circuits are successively scanned at a high level. This means that the current path P1 corresponding to the driver circuits does not include any position where a loose contact occurs.

Therefore, by synthesizing the measurement results shown in FIGS. 9A and 9B, it is found that a bonding point included in the current path P0 corresponding to the fifth driver circuit and not included in the current path P1 corresponding to the fifth driver circuit, that is, the bonding point of the top-surface bump FB0 and the back-surface bump BB1 is in a loose contact. When such an evaluation is performed for all bonding points, all the positions where a loose contact occurs can be identified. After the evaluation of loose contacts is completed, an exit command is issued to cause the semiconductor device 10 to exit from the test mode (Step S7). This completes a series of the test operation.

As described above, with the test method for the semiconductor device according to the present embodiment, positions where a loose contact occurs can be easily identified only by monitoring the consumption current Im by the tester 30 while successively scanning a plurality of driver circuits. Accordingly, positions where a loose contact occurs can be rapidly identified without mounting a highly accurate load circuit or measurement circuit on each semiconductor chip. A bidirectional data bus including a loose contact can be replaced by an auxiliary bidirectional data bus to relieve a failure.

While all the driver circuits in the control chip CC are set to a low level and the driver circuits in a selected memory chip MC are set to a high level in turn in the test method mentioned above, the test method according to the present invention is not limited thereto. It is also possible to conversely set all the driver circuits in a selected memory chip MC to a low level and to set the driver circuits in the control chip CC to a high level in turn. In this case, while a current flows in the opposite direction, an evaluation identical to that explained above can be performed. Also in this case, the driver circuits included in unselected memory chips need to be in a high impedance state.

While a through current is caused to flow by causing a bus fight between the control chip CC and each of the memory chips MC in the test method mentioned above, a through current can be caused to flow by causing a bus fight between two of the memory chips MC.

Figure 10A:
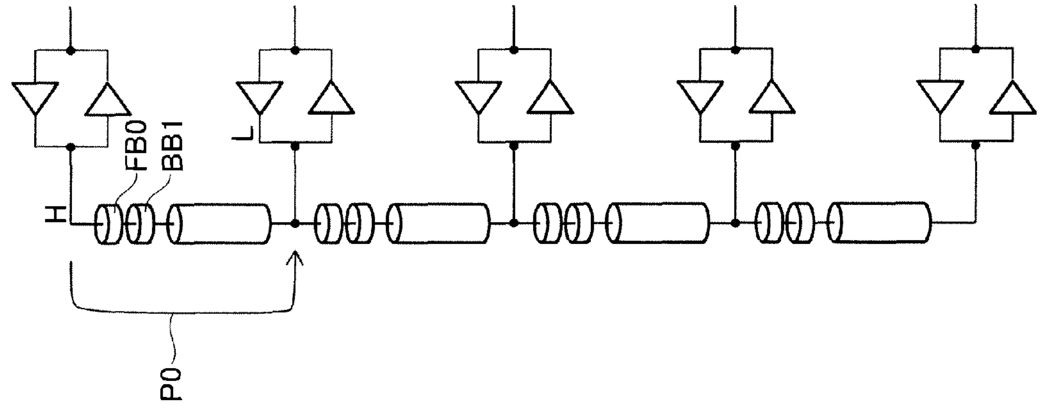
FIG. 10A is a schematic diagram showing an example in which a bus fight is caused between the memory chip MC0 and the memory chip MC1.
Figure 10B:
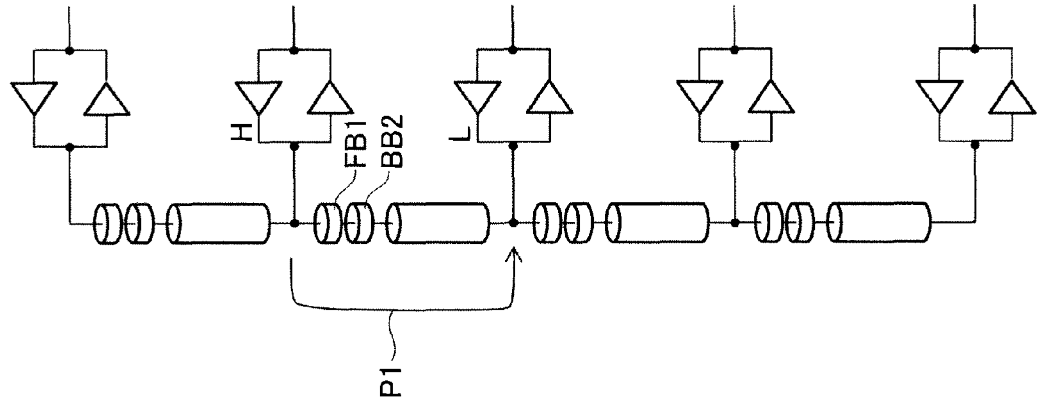
FIG. 10B is a schematic diagram showing an example in which a bus fight is caused between the memory chip MC1 and the memory chip MC2.
Figure 10C:
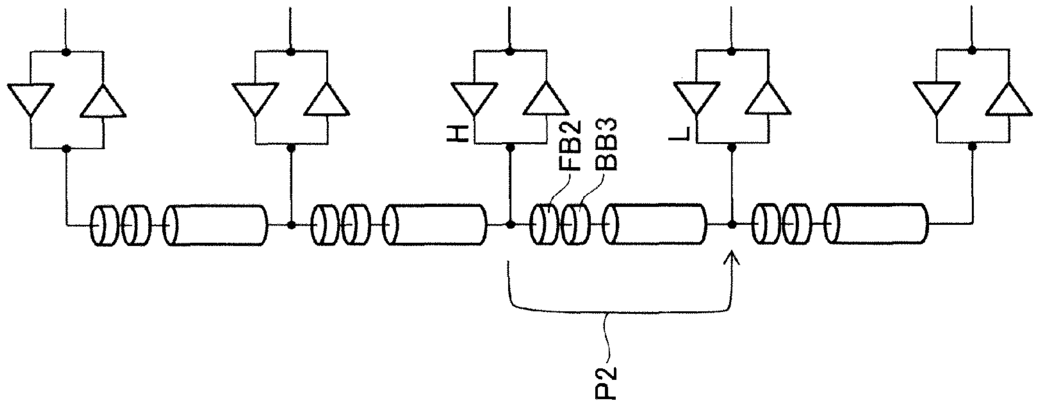
FIG. 10C is a schematic diagram showing an example in which a bus fight is caused between the memory chip MC2 and the memory chip MC3.

Turning to FIG. 10A, because there is only one bonding point of the top-surface bump FB0 and the back-surface bump BB1 on the current path P0 to be tested in this case, whether a loose contact occurs in this bonding point can be evaluated. Turning to FIG. 10B, because there is only one bonding point of the top-surface bump FB1 and the back-surface bump BB2 on the current path P1 to be tested in this case, whether a loose contact occurs in this bonding point can be evaluated. Turning to FIG. 10C, because there is only one bonding point of the top-surface bump FB2 and the back-surface bump BB3 on the current path P2 to be tested in this case, whether a loose contact occurs in this bonding point can be evaluated.

Figure 11:
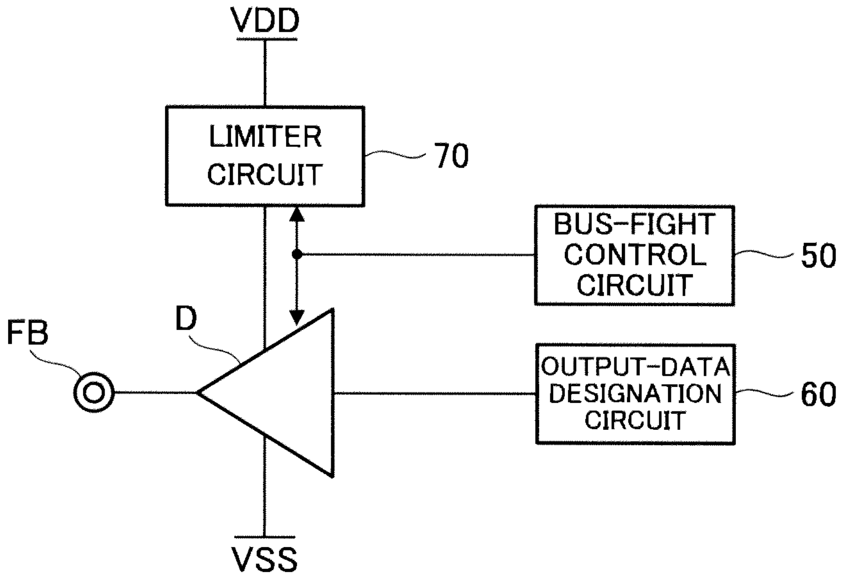
FIG. 11 is a circuit diagram showing an example in which a limiter circuit 70 is connected to a driver circuit D.

Turning to FIG. 11, it is also preferable to connect the limiter circuit 70 to the driver circuit D. The limiter circuit 70 limits an amount of a current flowing through the driver circuit D and is activated by the bus-fight control circuit 50. When the limiter circuit 70 is used, an amount of a through current flowing when a bus fight is caused in a test mode is substantially constant, which increases accuracy in the evaluation by the tester 30. The limiter circuit 70 can be provided for each driver circuit D or can be commonly provided for a plurality of the driver circuits D.

While the method of detecting a loose contact occurring in a so-called bidirectional data bus has been explained above, a loose contact can be detected even in a unidirectional data bus such as an address bus or a command bus by the same method as that explained in the present embodiment when a driver circuit for a bus-fight is added. Because the address bus and the command bus are buses for transmitting a signal (an address or a command) for accessing a memory cell array in a normal operation mode, these buses are unidirectional buses from the control chip CC to the memory chips MC0 to MC3.

Figure 12:
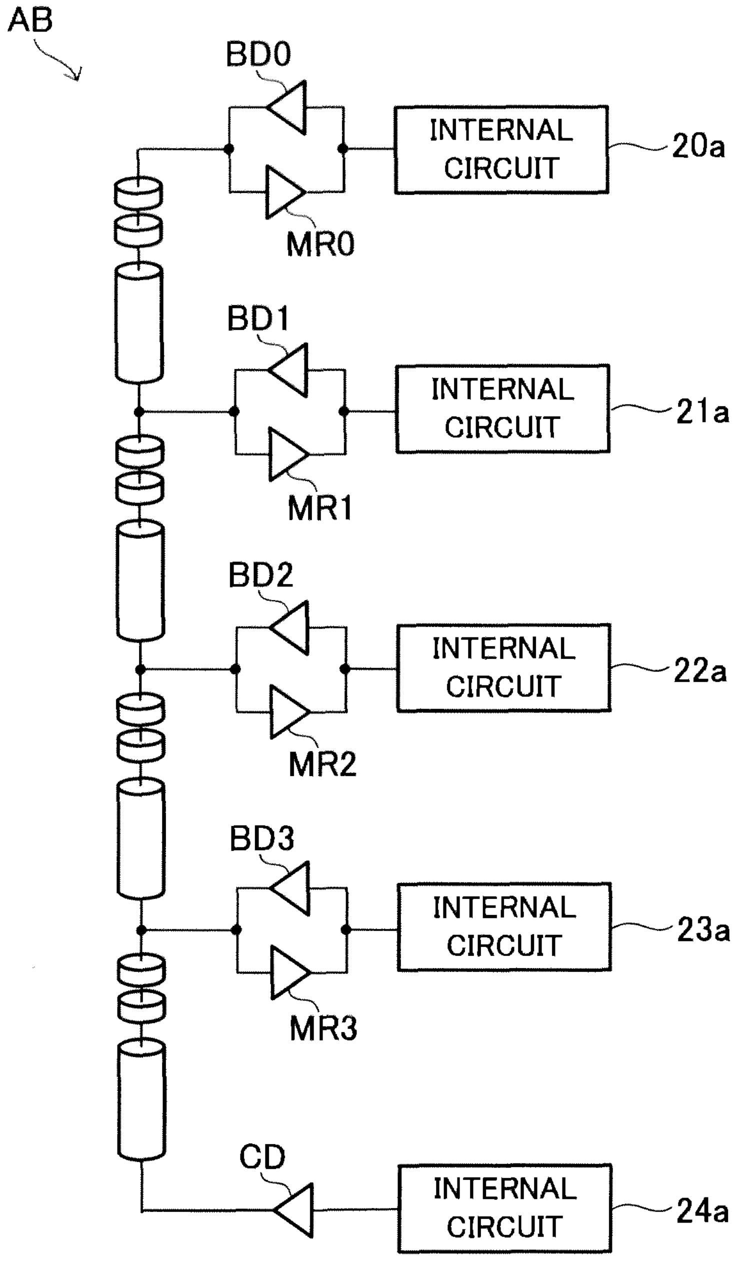
FIG. 12 is a circuit diagram showing an example in which a loose contact occurring in an address bus AB can be detected.

Turning to FIG. 12, an internal circuit 24*a* included in the control chip CC is an address output circuit that outputs predetermined bits of an address signal. Internal circuits 20*a* to 23*a* included in the memory chips MC0 to MC3 are address input circuits that receive the predetermined bits of the address signal, respectively. Because the internal circuits 20*a* to 23*a* are circuits dedicated to reception, it suffices to connect receiver circuits MR0 to MR3 at the previous stage thereof, respectively. However, in the example shown in FIG. 12, bus-fight driver circuits BD0 to BD3 for detecting a loose contact occurring on the address bus are added thereto, thereby enabling a bus fight to occur. In this way, also in a unidirectional bus such as an address bus or a command bus, a loose contact can be detected by addition of the bus-fight driver circuits.

Figure 13:
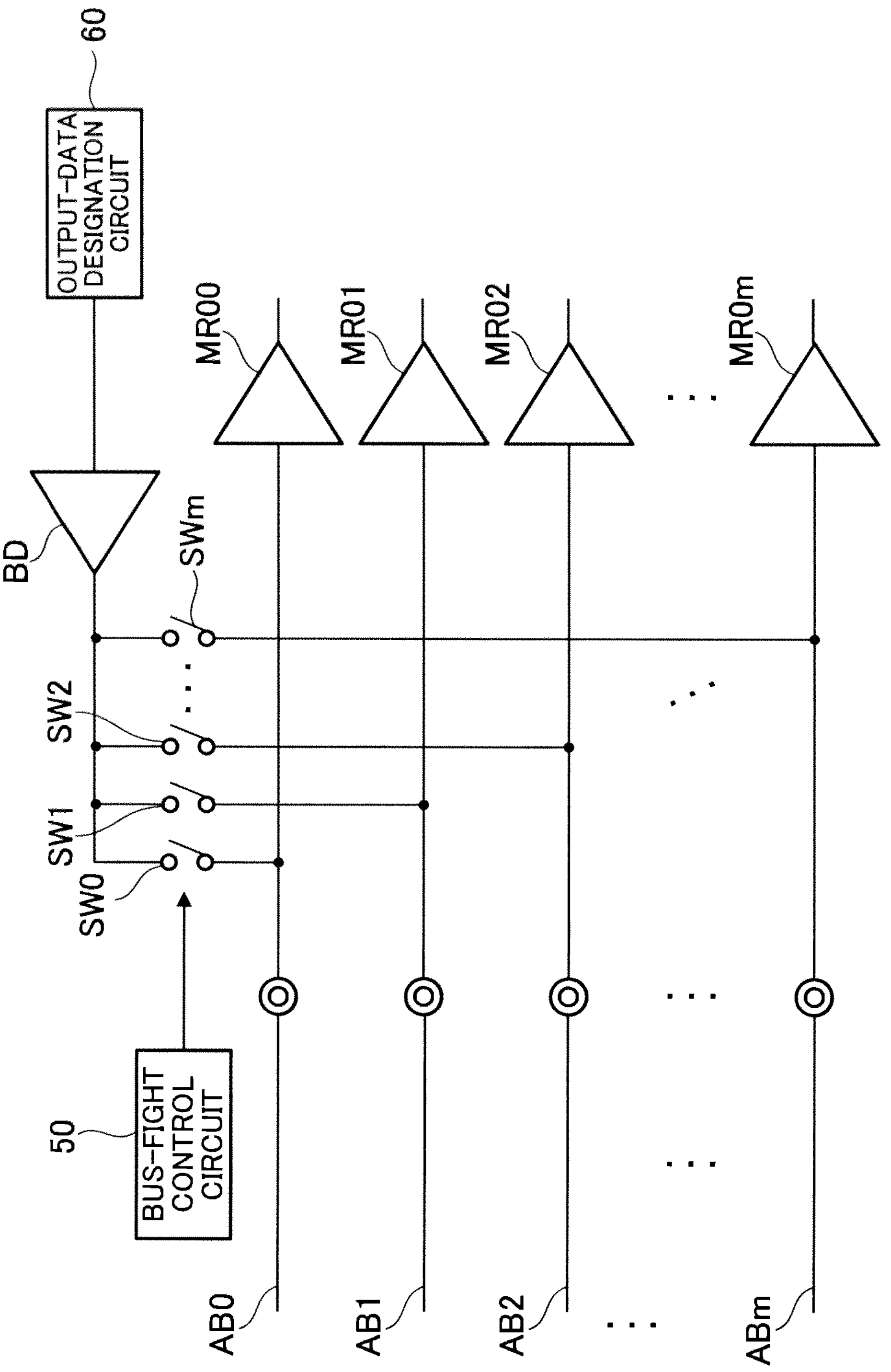
FIG. 13 is a circuit diagram showing an example in which one driver circuit is commonly assigned to a plurality of address buses AB0 to ABm.

It is unnecessary to provide the bus-fight driver circuit for each bus and one driver circuit can he commonly assigned to a plurality of address buses AB0 to ABm as shown in FIG. 13. In an example shown in FIG. 13, one driver circuit BD is assigned to m+1 address buses AB0 to ABm connected to receiver circuits MR00 to MR0*m*, respectively. By turning ON one of switches SW0 to SWm with the bus-fight control circuit 50, a bus fight can be caused on an arbitrary address bus in a test mode. Because this circuit configuration can reduce the number of driver circuits to be added for a bus fight, an increase in the chip area can be suppressed to the minimum.

It is apparent that the present invention is not limited to the above embodiments, but may be modified and changed without departing from the scope and spirit of the invention.

The present invention enables an evaluation in a case where two semiconductor chips are stacked on each other in such a manner that the bump electrodes are bonded as to whether a loose contact occurs in the corresponding bonding point. Therefore, a structure of a signal path including this bonding point is not particularly limited. Accordingly, while each signal path includes the penetrating electrodes TSV in the present embodiment, the present invention is not limited thereto.

Furthermore, while the semiconductor device including the memory chips MC0 to MC3 and the control chips CC stacked on each other has been explained in the present embodiment as an example, types of the semiconductor chips to be stacked are not limited thereto.

What is claimed is:

1. A method for testing a semiconductor device, the method comprising:

preparing a first semiconductor chip having a first bump electrode and a first driver circuit that drives the first bump electrode, and a second semiconductor chip having a second bump electrode and a second driver circuit that drives the second bump electrode;

staking the first and second semiconductor chips so that the first bump electrode and the second bump electrode are electrically connected to each other to form a current path including the first and second bump electrodes;

driving, in a test mode, the current path to a first potential by the first driver circuit while driving the current path to a second potential different from the first potential by the second driver circuit; and measuring a consumption current flowing through at least one of the first and second semiconductor chips during the test mode.

2. The method for testing the semiconductor device as claimed in claim 1, further comprising driving, in a normal operation mode, the current path to one of the first and second potentials by the first driver circuit while keeping the second driver circuit in a high impedance state relative to the current path.

3. The method for testing the semiconductor device as claimed in claim 2, further comprising driving, in the normal operation mode, the current path to one of the first and second potentials by the second driver circuit while keeping the first driver circuit in a high impedance state relative to the current path.

4. The method for testing the semiconductor device as claimed in claim 1, wherein the first semiconductor chip includes a plurality of the first bump electrodes, the second semiconductor chip includes a plurality of the second bump electrodes, each of the first bump electrodes is electrically connected to an associated one of the second bump electrodes to form a plurality of the current paths, and in the test mode, the current paths are driven to the second potential in turn while all the current paths are driven to the first potential.

5. The method for testing the semiconductor device as claimed in claim 1, further comprising preparing a third semiconductor chip having a third bump electrode and a third driver circuit that drives the third bump electrode, wherein the second semiconductor chip further includes a fourth bump electrode formed on an opposite side to a surface on which the second bump electrode is formed, and a penetrating electrode that is formed to pass through the second semiconductor chip and connects the second bump electrode to the fourth bump electrode, the second and third semiconductor chips are stacked on each other to electrically connect the fourth bump electrode to the third bump electrode, whereby the current path includes the first to fourth bump electrodes, and in the test mode, the third driver circuit is kept in a high impedance state relative to the current path, while the first driver circuit drives the current path to the first potential and the second driver circuit drives the current path to the second potential.

6. The method for testing the semiconductor device as claimed in claim 5, wherein in the test mode, the second driver circuit is kept in a high impedance state relative to the current path while the first driver circuit drives the current path to the first potential and the third driver circuit drives the current path to the second potential.

7. The method for testing the semiconductor device as claimed in claim 1, wherein a current flowing through the current path is limited in the test mode.

8. The method for testing the semiconductor device as claimed in claim 3, wherein the first semiconductor chip is a memory chip having a memory cell array, and the second semiconductor chip is a control chip that controls the memory chip.

9. The method for testing the semiconductor device as claimed in claim 8, wherein in the normal operation mode, the first driver circuit outputs read data that is read from the memory cell array to the second semiconductor chip via the current path, and the second driver circuit outputs write data that is to be written in the memory cell array to the first semiconductor chip via the current path.

10. The method for testing the semiconductor device as claimed in claim 8, wherein in the normal operation mode, the second driver circuit outputs a signal for accessing the memory cell array to the first semiconductor chip via the current path.

* * * * *